(12) United States Patent
Fan

(10) Patent No.: US 12,013,417 B2
(45) Date of Patent: Jun. 18, 2024

(54) CLOSED LOOP CURRENT TRANSFORMER

(71) Applicant: SHENZHEN ZHIYONG ELECTRONICS CO., LTD., Guangdong (CN)

(72) Inventor: Xiaoming Fan, Guangdong (CN)

(73) Assignee: SHENZHEN ZHIYONG ELECTRONICS CO., LTD., Shenzhen (CN)

( * ) Notice: Subject to any disclaimer, the term of this patent is extended or adjusted under 35 U.S.C. 154(b) by 274 days.

(21) Appl. No.: 17/640,855

(22) PCT Filed: Apr. 24, 2020

(86) PCT No.: PCT/CN2020/086667
§ 371 (c)(1),
(2) Date: Mar. 7, 2022

(87) PCT Pub. No.: WO2021/208135
PCT Pub. Date: Oct. 21, 2021

(65) Prior Publication Data
US 2022/0334146 A1 Oct. 20, 2022

(30) Foreign Application Priority Data

Apr. 13, 2020 (CN) .......................... 202010286058.2

(51) Int. Cl.
*G01R 15/18* (2006.01)
*G01R 15/20* (2006.01)
(Continued)

(52) U.S. Cl.
CPC ......... *G01R 15/181* (2013.01); *G01R 15/202* (2013.01); *G01R 19/0092* (2013.01); *H03F 3/20* (2013.01)

(58) Field of Classification Search
CPC ................ G01R 15/181; G01R 15/202; G01R 19/0092; G01R 15/185; H03F 3/20; H01F 38/32
(Continued)

(56) References Cited

U.S. PATENT DOCUMENTS

2003/0179063 A1* 9/2003 Preusse ................ G01R 15/185
336/182
2006/0119342 A1* 6/2006 Teulings ............... G01R 15/185
324/117 H

FOREIGN PATENT DOCUMENTS

CN 203133146 U 8/2013
CN 103592490 A 2/2014
(Continued)

OTHER PUBLICATIONS

International Search Report of PCT Patent Application No. PCT/CN2020/086667 issued on Jan. 18, 2021.

*Primary Examiner* — Raul J Rios Russo

(57) ABSTRACT

The application provides a closed loop current transformer, in which a hall element is positioned in a notch of a magnetic ring and is used for generating an induced voltage according to the magnetic field generated in the magnetic ring by current to be measured. A first compensating coil and a second compensating coil are wound on opposite sides of the magnetic ring in the same winding direction. An input end of the power amplifier circuit is connected with an output end of the hall element, and an output end is connected with the first compensating coil and the second compensating coil respectively. The other ends of the first compensating coil and the second compensating coil are respectively connected with a signal detection circuit, and an output end of the signal detection circuit is used as an output end of the closed loop current transform.

12 Claims, 6 Drawing Sheets

(51) Int. Cl.
*G01R 19/00* (2006.01)
*H03F 3/20* (2006.01)

(58) Field of Classification Search
USPC .......................................................... 324/127
See application file for complete search history.

(56) References Cited

FOREIGN PATENT DOCUMENTS

| | | |
|---|---|---|
| CN | 107462758 A | 12/2017 |
| CN | 209372940 U | 9/2019 |
| EP | 0354079 A1 | 2/1990 |

\* cited by examiner

CLOSED LOOP CURRENT TRANSFORMER

The present application claims the benefit of Chinese patent application No. 202010286058.2, titled "Closed loop current transformer", filed on Apr. 13, 2020.

TECHNICAL FIELD

The present application relates to the technical field of current detection, in particular to a closed loop current transformer.

BACKGROUND

The existing power system adopts AC voltage and large current loop to send power to user's terminal. Because of the high voltage and large current, it is impossible to directly use instruments for measurement when detecting and monitoring the power system. Current transformer came into being. By reducing AC voltage and large current proportionally to smaller values, the measurement can be performed by instruments directly. In the prior art, current transformers include open current transformers and closed loop current transformer. As shown in FIG. 1, a schematic diagram of the circuit structure of the existing closed loop current transformer, including a magnetic ring 01 with a notch, a hall element 02 positioned at the notch, a compensating coil 03 with the number of turns of N wound around the magnetic ring 01, and a conductor to be measured passes through the magnetic ring to form a relationship of magnetic field with the magnetic ring 01. In the existing closed loop current transformer, when the current to be measured (Ix) passes through the conductor to be measured, the hall element 02 outputs an induced voltage proportional to the magnetic field generated by the current to be measured (Ix). After passing through the amplifier 04, the induced voltage drives the power amplifier 05 to output a compensating current (Iy) to drive the compensating coil, so that the direction of the magnetic field generated by the compensating coil 03 is opposite to that generated by the current to be measured (Ix), so as to counteract the magnetic field generated by the current to be measured (Ix), and the induced voltage output by the hall element 02 would gradually decrease to 0, and the magnetic field in the magnetic ring 01 would accordingly become 0. When the magnetic field in the magnetic ring 01 is 0, the magnetic field generated by the compensating current (Iy) is equal to that generated by the current to be measured (Ix), and $N*Iy=Ix$. The current to be measured $(Ix)=N*Vo/R$ can be obtained by detecting the voltage value $Vo=Iy*R$ of the resistor R.

When the current to be measured (Ix) is positive DC, the compensating current (Iy) is also positive DC, and the power amplifier 05 absorbs energy from the positive power supply V+ and outputs the compensating current (Iy). Without considering the weak working current consumed by the power amplifier itself, the compensation current (Iy) is equal to the positive current I+ output by the positive power supply V+, and the current provided by the negative power supply V− is zero. Similarly, when the current to be measured (Ix) is negative DC, the negative power supply V− outputs the compensating current (Iy), and the current provided by the positive power supply V+ is zero.

However, the existing detection instruments provide limited positive and negative power when connecting to the current transformer. For example, an instrument can only provide an external sensor with a maximum positive power of +12V 0.5 A and negative power of −12V 0.5 A. When the detection instrument is used to power the closed loop current transformer, only the positive power supply/negative power supply is used to output positive compensating current/negative compensating current to drive the compensating coil, while the negative power supply/positive power supply is idle and the load of the positive power supply/negative power supply is large. On the other hand, the current to be measured is limited by the maximum current that can be provided by the positive or negative power supply, which is the product of the maximum current and the number of turns of the compensating coil.

SUMMARY

The present application provides a closed loop current transformer, aiming at solving the problems that the existing closed loop current transformer relies on unilateral power supply to output compensating current, and the power supply load is large and the compensating current is limited.

The present application is realized as follows: a closed loop current transformer is provided, including a magnetic ring, a hall element, a power amplifier circuit, a first compensating coil, a second compensating coil and a signal detection circuit;

the magnetic ring is an annular permeable magnetic cylinder with a notch;

the hall element is positioned in the notch of the magnetic ring and used for generating an induced voltage according to a primary magnetic field generated in the magnetic ring by a current to be measured;

the first compensating coil and the second compensating coil are both multi-turn coil, and wound on opposite sides of the magnetic ring in a same winding direction;

an input end of the power amplifier circuit is connected with an output end of the hall element, and an output end of the power amplifier circuit is connected with a first end of the first compensating coil and a first end of the second compensating coil respectively;

a second end of the first compensating coil is connected with a first input end of the signal detection circuit, and a second end of the second compensating coil is connected with a second input end of the signal detection circuit, an output end of the signal detection circuit is used as an output end of the closed loop current transformer; and when a wire to be measured passes through the magnetic ring and flows through the current to be measured, a primary magnetic field is generated in the magnetic ring, and the hall element is used to generate an induced voltage according to the primary magnetic field; and the power amplifier circuit is used for synchronously utilizing positive and negative power supplies to output the first compensating current and the second compensating current which are opposite to each other according to the induced voltage, the first compensating current is used to drive the first compensating coil, and the second compensating current is used to drive the second compensating coil, so that the first compensating coil and the second compensating coil generate a superposable magnetic field; the signal detection circuit is used for detecting the first compensating current and the second compensating current and outputting a voltage measurement value according to the first compensating current and the second compensating current; when a compensating magnetic field generated by the first compensating coil and the second compensating coil are superimposed to just counteract the primary magnetic field generated by the current to be measured, the voltage measurement value output by the signal detection circuit is proportional to the current to be measured.

Optionally, the power amplifier circuit includes an operational amplifier, a first power amplifier and a second power amplifier; the first power amplifier and the second power amplifier are mutually inverted power amplifiers, wherein voltage amplification factor of the first power amplifier is K, and voltage amplification factor of the second power amplifier is −K;

an input end of the operational amplifier is connected with the output end of the hall element;

an output end of the operational amplifier is connected with an input end of the first power amplifier and an input end of the second power amplifier respectively;

an output end of the first power amplifier is connected with the first end of the first compensating coil, and an output end of the second power amplifier is connected with the first end of the second compensating coil; and power input ends of the first power amplifier and the second power amplifier are commonly connected to a same positive power supply and negative power supply.

Optionally, the power input ends of the first power amplifier and the second power amplifier are commonly connected to a same positive power supply and negative power supply, the positive power supply and negative power supply are provided by a detection instrument.

Optionally, the signal detection circuit includes a first resistor, a second resistor and a differential amplifier;

a common connection node between a first end of the first resistor and the second end of the first compensating coil is connected with a non-inverting input of the differential amplifier, and a common connection node between a first end of the second resistor and the second end of the second compensating coil is connected with an inverting input of the differential amplifier;

a second end of the first resistor and a second end of the second resistor are commonly connected to a floating output; and an output end of the differential amplifier is used as the output end of the closed loop current transformer.

Optionally, the first compensating coil and the second compensating coil have a same number of turns, and the first resistor and the second resistor have a same resistance.

Optionally, the first compensating coil and the second compensating coil have different numbers of turns, and a ratio of the number of turns of the first compensating coil to the resistance of the first resistor is equal to a ratio of the number of turns of the second compensating coil to the resistance of the second resistor.

Optionally, the magnetic ring is a circular ring or a square ring.

The closed loop current transformer provided by the present application, includes a magnetic ring, a hall element, a power amplifier circuit, a first compensating coil, a second compensating coil and a signal detection circuit. The first compensating coil and the second compensating coil are respectively driven by mutually inversed compensating currents output by the power amplifier circuit, so that the compensating magnetic field generated by the first compensating coil and the second compensating coil are superimposed and then counteract the primary magnetic field generated by the current to be measured, therefore a positive power supply and negative power supply can be used synchronously to output a compensating current to drive the compensating coil. The positive and negative power supplies work at the same time, which is beneficial to reducing the compensating current, effectively solves the problem of large power load existing in the conventional closed loop current transformer which relies on unilateral power supply to output compensating current. And the positive compensating current and negative compensating current are synchronously detected by the signal detection circuit to obtain an output voltage value, so that the detectable range of the current to be measured can be effectively expanded without changing the maximum current provided by the detection instrument to the external current transformer.

BRIEF DESCRIPTION OF DRAWINGS

In order to more clearly illustrate the technical solution of the embodiments of the present application, the drawings in the description of the embodiments or the prior art is briefly introduced as follows. Obviously, the drawings in the following description are only some embodiments of the present application, and for those skilled in the art, other drawings may be obtained according to these drawings without any creative effort.

DETAILED DESCRIPTION OF DISCLOSED EMBODIMENTS

In order to make the purpose, technical solution and advantages of the present application clearer, the present application will be further described in detail below with reference to the drawings and embodiments. It should be understood that the specific embodiments described here are only used to illustrate the application, not to limit the application.

Figure 1:
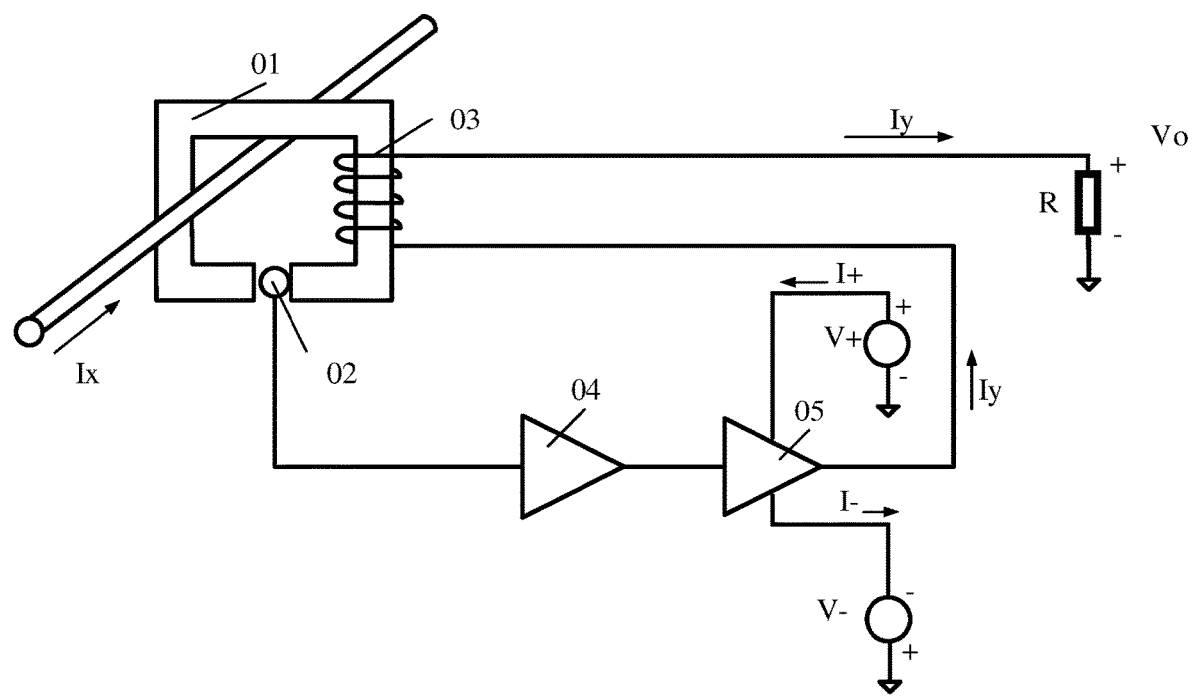
FIG. 1 is a schematic diagram of circuit structure of the existing closed loop current transformer.
Figure 2:
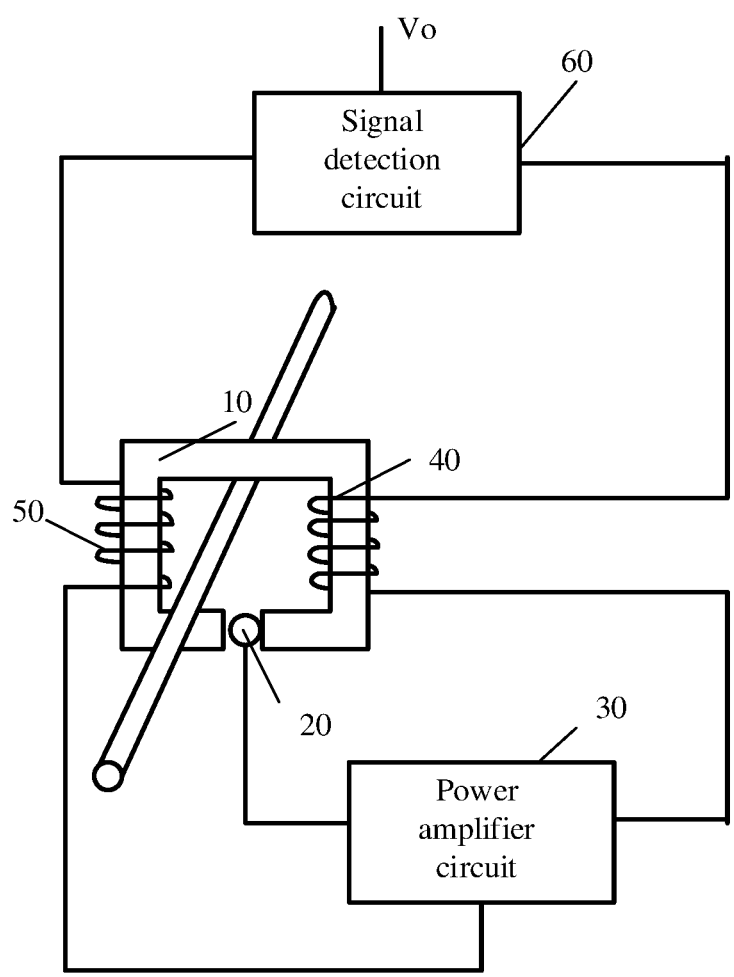
FIG. 2 is a schematic diagram of circuit structure of a closed loop current transformer provided by an embodiment of the present application.

The application provides a closed loop current transformer, which can be used for detecting direct current or alternating current in an electric power system. With the design of double compensating coils, positive and negative compensating currents are output to drive the two compensating coils to generate a superimposed magnetic field, to counteract the magnetic field generated by the current to be measured, so that the voltage drop of the compensating current on the current detection resistor can be measured, therefore the current to be measured can be obtained. FIG. 2 is a schematic diagram of circuit structure of a closed loop current transformer provided by an embodiment of the present application; As shown in FIG. 2, the closed loop current transformer includes a magnetic ring 10, a hall element 20, a power amplifier circuit 30, a first compensating coil 40, a second compensating coil 50 and a signal detection circuit 60.

The magnetic ring 10 is an annular permeable magnetic cylinder with a notch;

the hall element 20 is positioned in the notch of the magnetic ring 10 and used for generating an induced voltage according to a primary magnetic field generated in the magnetic ring 10 by a current to be measured;

the first compensating coil 40 and the second compensating coil 50 are both multi-turn coil, and wound on opposite sides of the magnetic ring 10 in a same winding direction;

an input end of the power amplifier circuit 30 is connected with an output end of the hall element 20, and an output end of the power amplifier circuit 30 is connected with a first end of the first compensating coil 40 and a first end of the second compensating coil 50 respectively;

a second end of the first compensating coil 40 is connected with a first input end of the signal detection circuit 60, and a second end of the second compensating coil 50 is connected with a second input end of the signal detection circuit 60, an output end of the signal detection circuit 60 is used as an output end of the closed loop current transformer; and when a wire to be measured passes through the magnetic ring 10 and flows through the current to be measured, a primary magnetic field is generated in the magnetic ring 10, and the hall element 20 is used to generate an induced voltage according to the primary magnetic field; and the power amplifier circuit 30 is used for synchronously utilizing positive and negative power supplies to output the first compensating current and the second compensating current which are opposite to each other according to the induced voltage, the first compensating current is used to drive the first compensating coil 40, and the second compensating current is used to drive the second compensating coil 50, so that the first compensating coil 40 and the second compensating coil 50 generate a superposable magnetic field; the signal detection circuit 60 is used for detecting the first compensating current and the second compensating current and outputting a voltage measurement value according to the first compensating current and the second compensating current; when a compensating magnetic field generated by the first compensating coil 40 and the second compensating coil 50 are superimposed to just counteract the primary magnetic field generated by the current to be measured, the voltage measurement value output by the signal detection circuit 60 is proportional to the current to be measured.

In this embodiment, the wire to be measured is placed in the magnetic ring 10, and the magnetic ring 10 is a circular ring or a square ring. When the current to be measured current I1 flows through the wire to be measured, a primary magnetic field is generated in the magnetic ring 10, and the magnitude of the primary magnetic field is proportional to the magnitude of the current to be measured IL The hall element 20 is used to sense the magnitude of the primary magnetic field, generate an induced voltage according to the magnitude of the primary magnetic field, and output the induced voltage to the power amplifier circuit 30. The positive and negative power supplies of the power amplifier circuit 30 are respectively connected with the positive and negative power supplies provided by a detection instrument for adjusting the induced voltage, and then output the first compensating current I2 and the second compensating current I3 which are opposite to each other. The first compensating current I2 is used to drive the first compensating coil 40 to generate a compensating magnetic field. The second compensating current I3 is used to drive the second compensating coil 50 to generate a compensating magnetic field. The first compensating coil 40 and the second compensating coil 50 are wound on opposite sides of the magnetic ring 10, and the winding directions are the same. When the opposite first compensating current I2 and second compensating current I3 flow through the first compensating coil 40 and the second compensating coil 50 respectively, according to Ampere's Law, it can be concluded that the directions of the compensating magnetic fields generated by the first compensating coil 40 and the second compensating coil 50 in the magnetic ring 10 are the same, and the two compensating magnetic fields can be superimposed. The signal detection circuit 60 is used to detect the voltage drop that occurs after the first compensating current I2 and the second compensating current I3 pass through the current detection resistor, and generate and output a voltage measurement value. When the induced voltage of the hall element 20 is 0, the magnetic field in the magnetic ring 10 is 0, that is, the compensating magnetic fields generated by the first compensating coil 40 and the second compensating coil 50 are superimposed to just counteract the primary magnetic field generated by the current to be measured. At this point, the voltage measurement value Vo output by the signal detection circuit 60 is proportional to the current to be measured I1. The current to be measured I1 can be deduced from the voltage measurement value Vo output by the signal detection circuit 60, thus realizing the detection of the current to be measured I1. It should be understood that the winding method of the first compensating coil 40 and the second compensating coil 50 shown in FIG. 2 mentioned above is only an example of the present application. In practical application, the winding method opposite to that shown in FIG. 2 may also be used.

In this embodiment, through the design of double compensating coils, in combination with the power amplifier circuit 30, positive and negative power supplies are synchronously utilized to output the opposite compensating currents to drive the compensating coils, which is beneficial to reducing the compensating current, avoiding driving the compensating coil by the compensating current output only by the positive power supply or the negative power supply, and effectively solving the problem that the existing closed loop current transformer relies on the unilateral power supply to output the compensating current with large power load. The signal detection circuit synchronously detects the positive compensating current and the negative compensating current and outputs the voltage measurement value, which can effectively expand the detectable range of the current to be measured without changing the maximum current provided by the detection instrument to the external current transformer.

Figure 3:
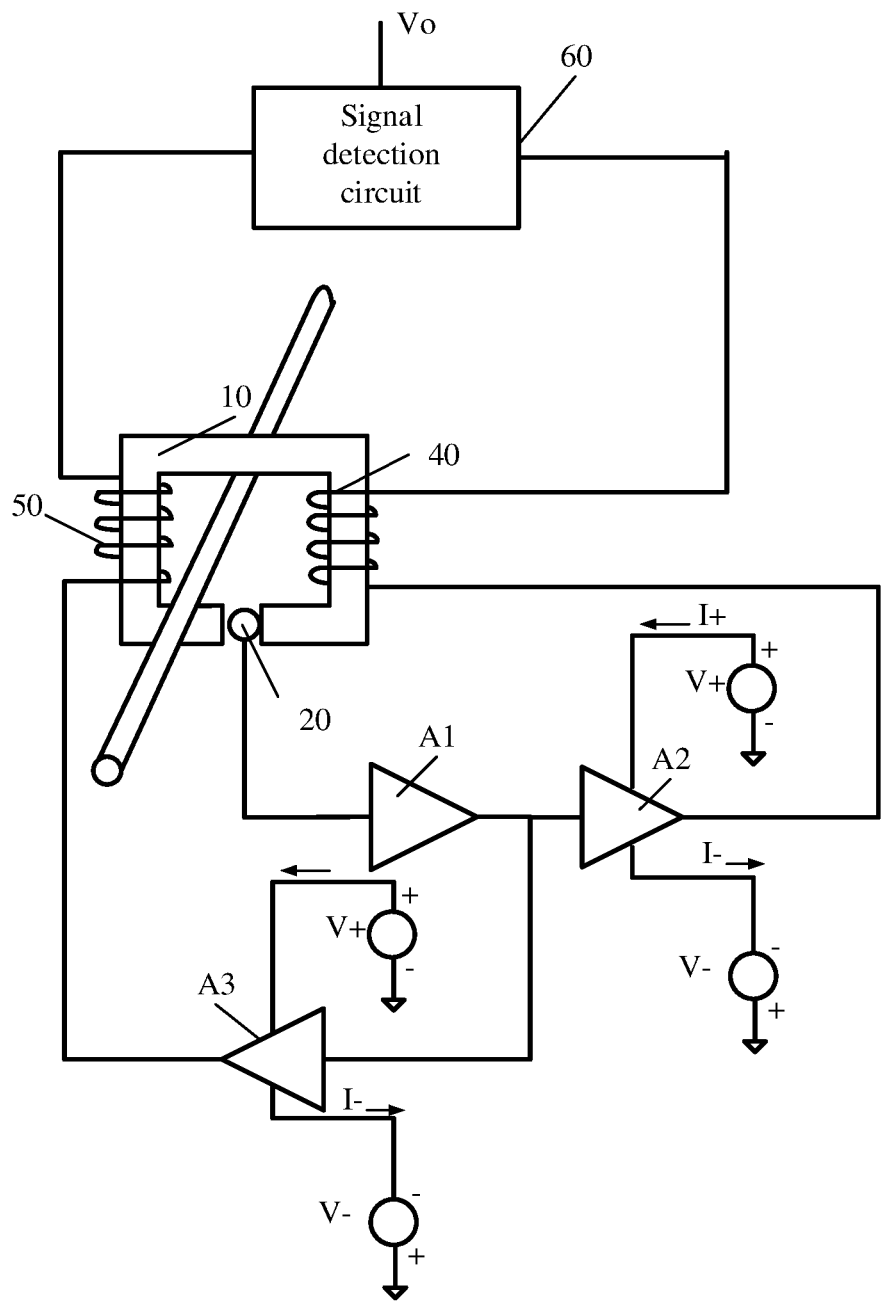
FIG. 3 is a schematic diagram of circuit structure of a closed loop current transformer provided by an embodiment of the present application.

Specifically, in an embodiment, as shown in FIG. 3, the power amplifier circuit 30 includes an operational amplifier A1, a first power amplifier A2 and a second power amplifier A3; the first power amplifier A2 and the second power amplifier A3 are mutually inverted power amplifiers, wherein the voltage amplification factor of the first power amplifier A2 is K, and the voltage amplification factor of the second power amplifier A3 is −K;

an input end of the operational amplifier A1 is connected with the output end of the hall element 20;

an output end of the operational amplifier A1 is connected with an input end of the first power amplifier A2 and an input end of the second power amplifier A3 respectively;

an output end of the first power amplifier A2 is connected with the first end of the first compensating coil 40, and an output end of the second power amplifier A3 is connected with the first end of the second compensating coil 50; and power input ends of the first power amplifier A2 and the second power amplifier A3 are commonly connected to a same positive power supply V+ and negative power supply V−.

In this embodiment, a power amplifier is added on the basis of the existing closed loop current transformer, and there are two power amplifiers, namely the first power amplifier A2 and second power amplifier A3. The voltage amplification factor of the first power amplifier A2 is the same as that of the second power amplifier A3, but the direction is opposite. The input end of power supply is connected with the positive power supply and the negative power supply provided by the detection instrument respectively, and the output end is connected with the first compensating coil 40 and the second compensating coil 50 respectively. After the induced voltage generated by the hall element 20 is supplied to the operational amplifier A1, the operational amplifier A amplifies the induced voltage and then supplies it to the first power amplifier A2 and second power amplifier A3, so that the first power amplifier A2 and second power amplifier A3 are driven to generate the first compensating current I2 and second compensating current I3 which are opposite to each other, and then the first compensating coil 40 and second compensating coil 50 are driven to generate a superimposed compensating magnetic field.

Figure 4:
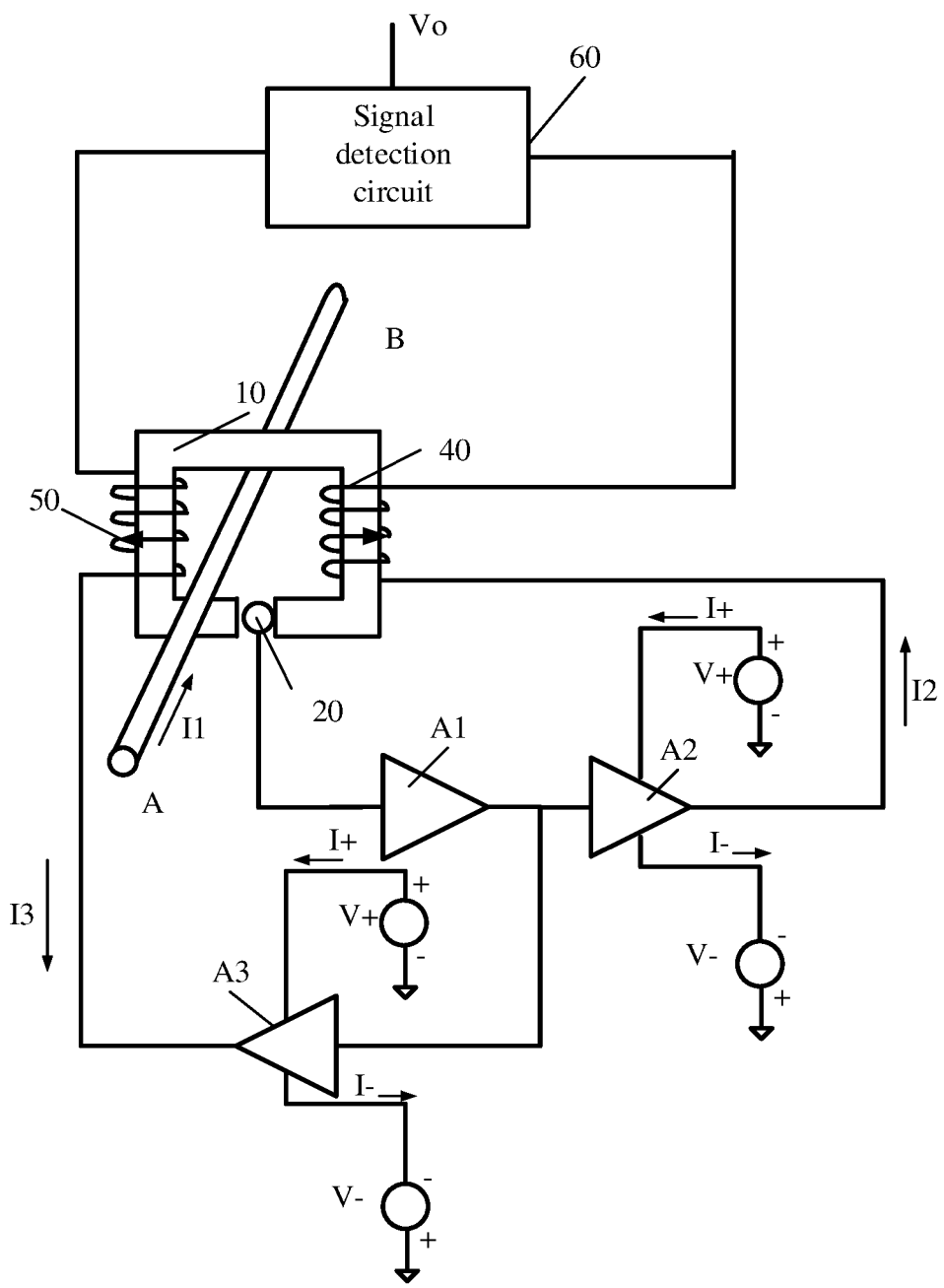
FIG. 4 is a schematic diagram of magnetic field of a closed loop current transformer provided by an embodiment of the present application.

If the voltage amplification factor of the first power amplifier A2 is K and the voltage amplification factor of the second power amplifier A3 is −K (K is a positive number), the currents output by the first power amplifier A2 and the second power amplifier A3 are opposite. For ease of understanding, take the winding direction of the compensating coil shown in FIG. 2 as an example. As shown in FIG. 4, when the current to be measured I1 passing through the wire to be measured is a positive current, it is defined here that the current to be measured flowing from A to B is a positive current. Current to be measured I1 generates a clockwise primary magnetic field in the magnetic ring 10, while the hall element 20 generates a positive induced voltage according to the primary magnetic field, which is supplied to the operational amplifier A1. The operational amplifier A1 amplifies the induced voltage and then supplies it to the first power amplifier A2 and the second power amplifier A3. The first power amplifier A2 absorbs energy from the positive power supply and amplifies it by K times to generate the first compensating current I2, and the second power amplifier A3 absorbs energy from the positive power supply and amplifies it by −K times to generate the second compensating current I3. The first compensating current I2 is a positive current, which is used to drive the first compensating coil 40, so that the first compensating coil 40 generates a counter-clockwise compensating magnetic field in the magnetic ring 10. The second compensating current I3 is a negative current, which is used to drive the second compensating coil 50, so that the second compensating coil 50 generates a counter-clockwise compensating magnetic field in the magnetic ring 10. The directions of the two compensating magnetic fields are the same, superposable and opposite to the direction of the primary magnetic field generated by the current to be measured, so that the primary magnetic field generated by the current to be measured can be cancelled out.

Figure 5:
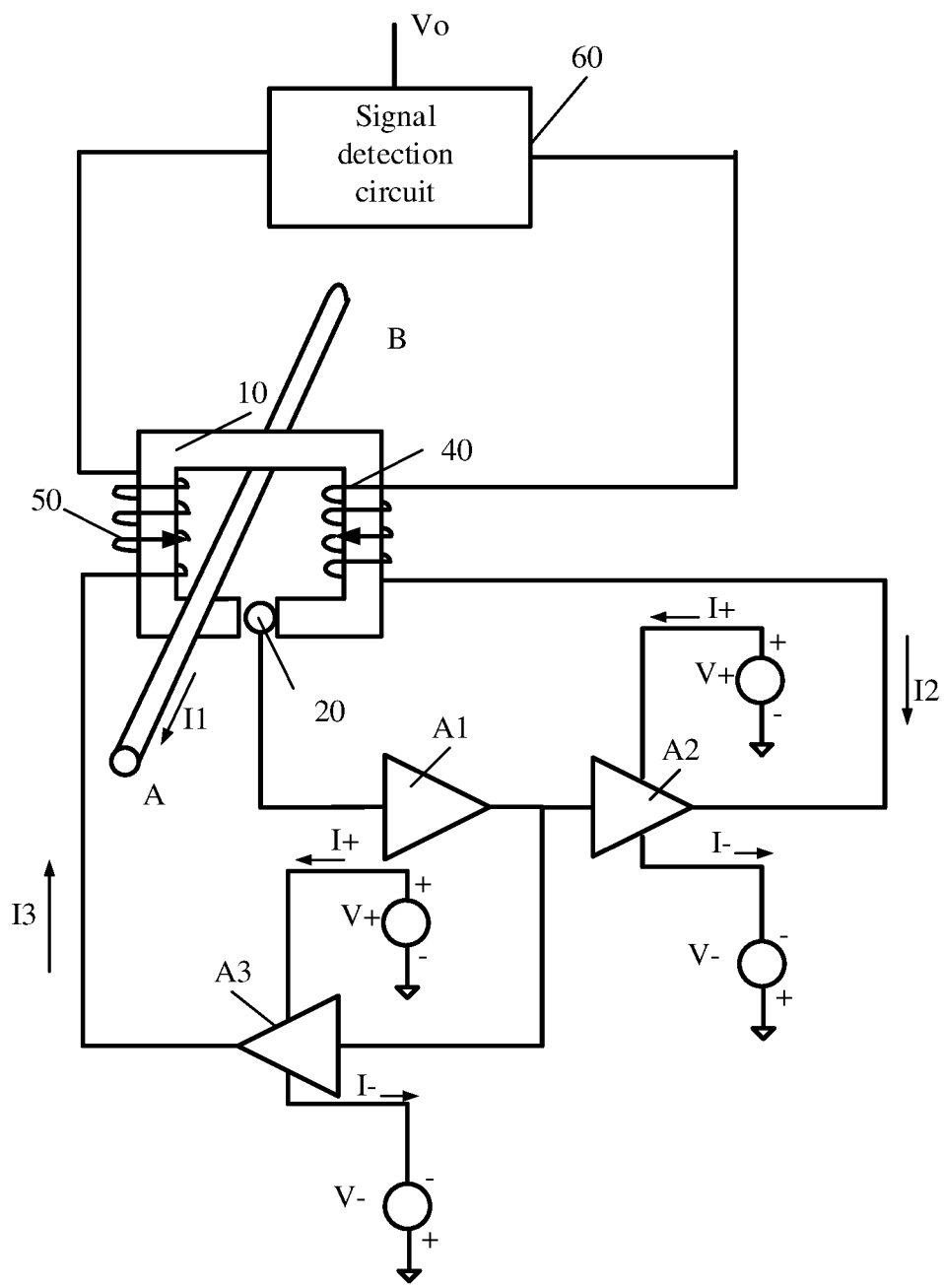
FIG. 5 is a schematic diagram of magnetic field of a closed loop current transformer provided by an embodiment of the present application.

As shown in FIG. 5, when the current to be measured I1 passing through the wire to be measured is a negative current, it is defined here that the current to be measured flowing from B to A is a negative current. Current to be measured I1 generates a counter-clockwise primary magnetic field in the magnetic ring 10, while the hall element 20 generates a negative induced voltage according to the primary magnetic field, which is supplied to the operational amplifier A1. The operational amplifier A1 amplifies the induced voltage and then supplies it to the first power amplifier A2 and the second power amplifier A3. The first power amplifier A2 absorbs energy from the negative power supply and amplifies it by K times to generate the first compensating current I2, and the second power amplifier A3 absorbs energy from the negative power supply and amplifies it by −K times to generate the second compensating current I3. The first compensating current I2 is a negative current, which is used to drive the first compensating coil 40, so that the first compensating coil 40 generates a clockwise compensating magnetic field in the magnetic ring 10. The second compensating current I3 is a positive current, which is used to drive the second compensating coil 50, so that the second compensating coil 50 generates a clockwise compensating magnetic field in the magnetic ring 10. The directions of the two compensating magnetic fields are the same, superposable and opposite to the direction of the primary magnetic field generated by the current to be measured, so that the primary magnetic field generated by the current to be measured can be cancelled out.

In this embodiment, by adding a power amplifier which is opposite to the original power amplifier, the two power amplifiers absorb energy from the positive power supply and the negative power supply respectively to generate compensating current and drive the compensating coil, which is beneficial to reducing the compensating current, avoiding driving the compensating coil by the compensating current output only by using the positive power supply or the negative power supply, and effectively solving the problem of large power load of the existing closed loop current transformer, which relies on the unilateral power supply to output compensating current.

Figure 6:
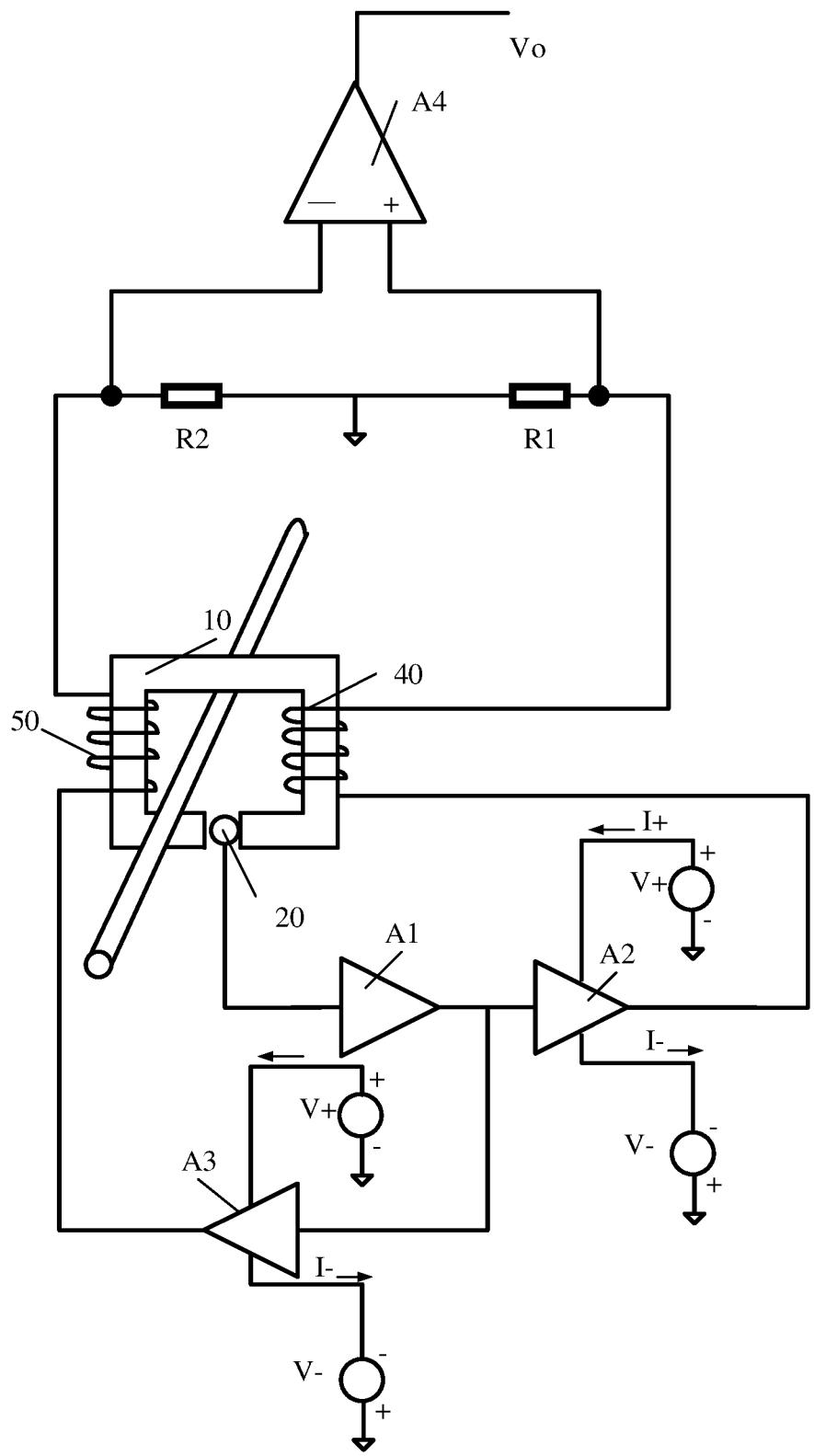
FIG. 6 is a schematic diagram of circuit structure of a closed loop current transformer provided by an embodiment of the present application.

Specifically, in an embodiment, as shown in FIG. 6, the signal detection circuit 60 includes a first resistor R1, a second resistor R2 and a differential amplifier A4. The resistance of the first resistor R1 and the second resistor R2 are the same.

A common connection node between a first end of the first resistor R1 and the second end of the first compensating coil 40 is connected with a non-inverting input of the differential amplifier A4, and a common connection node between a first end of the second resistor R2 and the second end of the second compensating coil 50 is connected with an inverting input of the differential amplifier A4;

a second end of the first resistor R1 and a second end of the second resistor R2 are commonly connected to a floating output; and an output end of the differential amplifier A4 is used as the output end of the closed loop current transformer.

In this embodiment, the signal detection circuit 60 is used to output a voltage value proportional to the current to be measured when the magnetic field in the magnetic ring 10 is 0. If the current to be measured is I1, the number of turns of the first compensating coil 40 is N1, the number of turns of the second compensating coil 50 is N2, the first compensating current is I2, second compensating current is I3, and when the magnetic field in the magnetic ring 10 is 0, $I1=N1*I2+N2*I3$ (1) can be obtained. At the detection end, in this embodiment, the first resistor R1 is connected in series with ground in the first compensating coil 40 and the second resistor R2 is connected in series with ground in the second compensating coil 50. When the voltage amplification factor of the differential amplifier A4 is 1, the voltage measurement value Vo output by the output end of the differential amplifier A4 is the sum of the voltage V1 on the resistor R1 and the voltage V2 on the resistor R2, $Vo=V1+V2$, where $V2=I2*R1$ and $V2=I3*R2$. When the magnetic field in the magnetic ring 10 is 0, $I1=V1*N1/R1+V2*N2/R2$ (2) can be obtained. By choosing suitable R1 and R2, the corresponding relationship between Vo and current I1 can be obtained.

Optionally, as an embodiment of the present application, in order to solve the equation conveniently and improve the user experience of using the closed loop current transformer, the number of turns of the first compensating coil 40 and the second compensating coil 50 may be the same, both of which are N, and the resistance of the first resistor R1 may be the same as that of the second resistor R2, both of which are R. When the magnetic field in the magnetic ring 10 is 0, $I1=N1*I2+N2*I3=N (I2+I3)$, that is, $(I2+I3)=I1/N$ (3), $Vo=R*I2+R*I3=R (I2+I3)=R*I1/N$ (4). After detecting the output voltage measurement value Vo, the current to be measured I1 can be calculated according to the formula (4), thus completing the detection of the current to be measured.

Optionally, as another embodiment of the present application, when the number of turns of the first compensating coil 40 and the second compensating coil 50 are different, the ratio of the number of turns of the first compensating coil 40 to the resistance of the first resistor is equal to the ratio of the number of turns of the second compensating coil 50 to the resistance of the second resistor, that is, $N1/R1=N2/R2$ (5). When the magnetic field in the magnetic ring 10 is 0, $Vo=V1+V2$, $I1=N1*I2+N2*I3=V1*N1/R1+V2*N2/R2=(V1+V2)*N1/R1$ (6), after detecting the output voltage measurement value Vo, the current to be measured I1 can be calculated according to the formula (6), thus completing the detection of the current to be measured.

It should be noted that the above embodiment is described with the voltage amplification factor of the differential amplifier A4 being 1. In other embodiments, the voltage amplification factor of the differential amplifier A4 may also be other. By adjusting the voltage amplification factor of the differential amplifier A4, the reading range for the user on the detector meter can be changed, so that the user can read better.

Furthermore, if the positive and negative power supplies provided by the detection instrument are +12V 0.5 A and −12V 0.5 A, assuming that the number of turns of the compensating coil is 100 T, when the current to be measured Ix is positive, the existing closed loop current transformer only uses the positive power supply +12V 0.5 A to drive the compensating coil, while the negative power supply −12V 0.5 A is idle, and the maximum compensating current Iy is 0.5 A. At this point, the maximum measurable current to be measured Ix of the closed loop current transformer is 100*Iy=50 A. With the closed loop current transformer of this embodiment, the positive power supply +12V 0.5 A and the negative power supply −12V 0.5 A can be used to drive the compensating coil at the same time, and the maximum values of the first compensating current I2 and the second compensating current I3 are both 0.5 A. At this point, the maximum measurable current to be measured is $I1=N (I2+I3)=100 (I2+I3)=100$ A, and the measurable range of current to be measured is twice that of the existing single-coil closed loop current transformer.

To sum up, after the power amplifier circuit 30 synchronously outputs a positive compensating current and a negative compensating current to generate a superimposed compensating magnetic field. In this embodiment, by adding a group of power amplifiers and current detection resistors, the first compensating current and the second compensating current can be detected respectively. Then, the voltage drop caused by the first compensating current and the voltage drop caused by the second compensating current are superimposed by the differential amplifier A4 and taken as a voltage measurement value. Under the condition of not changing the maximum current provided by the detection instrument to the external current transformer, compared with the single-coil closed loop current transformer, it can effectively expand the detectable range of the current to be measured, reaching twice the original detection range of the current to be measured.

Optionally, as a preferred embodiment of the present application, the first compensating coil may be composed of one or more coils. If the number of coils included in the first compensating coil 40 is M1, then the power amplifier circuit 30 includes M1 first power amplifiers A2, and the signal detection circuit 60 includes M1 first resistors R1, one of the coils forms a compensating current path with one first power amplifier A2 and first resistor R1. That is, the first end of each coil is connected with the output end of a first power amplifier A2, and the second end is connected with the first end of a first resistor. The second compensating coil may also be composed of one or more coils. If the number of coils included in the second compensating coil 50 is M2, then the power amplifier circuit 30 includes M2 second power amplifiers A3, and the signal detection circuit 60 includes M2 second resistors R2, one of the coils forms a compensating current path with one second power amplifier A3 and second resistor R2. That is, the first end of each coil is connected with the output end of a second power amplifier A3, and the second end is connected with the first end of a second resistor. M1 and M2 are both positive integers, and M1 and M2 may be the same or different, which is not limited here.

The above embodiments are only used to illustrate the technical solutions of the present application, rather than limiting it. Although the present application has been described in detail with reference to the foregoing embodiments, those skilled in the art will appreciate that it is still possible to modify the technical solutions described in the foregoing embodiments, or equivalently replace some of its technical features. However, these modifications or substitutions do not make the essence of the corresponding technical solutions deviate from the spirit and scope of the technical solutions of each embodiment of the present application, and shall be included in the scope of protection of the present application.

What is claimed is:

1. A closed loop current transformer, characterized in that, comprising a magnetic ring, a hall element, a power amplifier circuit, a first compensating coil, a second compensating coil and a signal detection circuit;

the magnetic ring is an annular permeable magnetic cylinder with a notch;

the hall element is positioned in the notch of the magnetic ring and used for generating an induced voltage according to a primary magnetic field generated in the magnetic ring by a current to be measured;

the first compensating coil and the second compensating coil are both multi-turn coil, and wound on opposite sides of the magnetic ring in a same winding direction;

an input end of the power amplifier circuit is connected with an output end of the hall element, and an output end of the power amplifier circuit is connected with a first end of the first compensating coil and a first end of the second compensating coil respectively;

a second end of the first compensating coil is connected with a first input end of the signal detection circuit, and a second end of the second compensating coil is connected with a second input end of the signal detection circuit, an output end of the signal detection circuit is used as an output end of the closed loop current transformer; and when a wire to be measured passes through the magnetic ring and flows through the current to be measured, a primary magnetic field is generated in the magnetic ring, and the hall element is used to generate the induced voltage according to the primary magnetic field; and the power amplifier circuit is used for synchronously utilizing positive and negative power supplies to output the first compensating current and the second compensating current which are opposite to each other according to the induced voltage, the first compensating current is used to drive the first compensating coil, and the second compensating current is used to drive the second compensating coil, so that the first compensating coil and the second compensating coil generate a superposable magnetic field; the signal detection circuit is used for detecting the first compensating current and the second compensating current and outputting a voltage measurement value according to the first compensating current and the second compensating current; when a compensating magnetic field generated by the first compensating coil and the second compensating coil are superimposed to just counteract the primary magnetic field generated by the current to be measured, the voltage measurement value output by the signal detection circuit is proportional to the current to be measured.

2. The closed loop current transformer of claim 1, wherein the power amplifier circuit comprises an operational amplifier, a first power amplifier and a second power amplifier; the first power amplifier and the second power amplifier are mutually inverted power amplifiers, wherein voltage amplification factor of the first power amplifier is K, and voltage amplification factor of the second power amplifier is −K;

an input end of the operational amplifier is connected with the output end of the hall element;

an output end of the operational amplifier is connected with an input end of the first power amplifier and an input end of the second power amplifier respectively;

an output end of the first power amplifier is connected with the first end of the first compensating coil, and an output end of the second power amplifier is connected with the first end of the second compensating coil; and power input ends of the first power amplifier and the second power amplifier are commonly connected to a same positive power supply and negative power supply.

3. The closed loop current transformer of claim 2, wherein power input ends of the first power amplifier and the second power amplifier are commonly connected to a same positive power supply and negative power supply, the positive power supply and negative power supply are provided by a detection instrument.

4. The closed loop current transformer of claim 2, wherein the signal detection circuit comprises a first resistor, a second resistor and a differential amplifier;

a common connection node between a first end of the first resistor and the second end of the first compensating coil is connected with a non-inverting input of the differential amplifier, and a common connection node between a first end of the second resistor and the second end of the second compensating coil is connected with an inverting input of the differential amplifier;

a second end of the first resistor and a second end of the second resistor are commonly connected to a floating output; and an output end of the differential amplifier is used as the output end of the closed loop current transformer.

5. The closed loop current transformer of claim 4, wherein the first compensating coil and the second compensating coil have a same number of turns, and the first resistor and the second resistor have a same resistance.

6. The closed loop current transformer of claim 4, wherein the first compensating coil and the second compensating coil have different numbers of turns, and a ratio of the number of turns of the first compensating coil to the resistance of the first resistor is equal to a ratio of the number of turns of the second compensating coil to the resistance of the second resistor.

7. The closed loop current transformer of claim 1, wherein the magnetic ring is a circular ring or a square ring.

8. The closed loop current transformer of claim 2, wherein the magnetic ring is a circular ring or a square ring.

9. The closed loop current transformer of claim 3, wherein the magnetic ring is a circular ring or a square ring.

10. The closed loop current transformer of claim 4, wherein the magnetic ring is a circular ring or a square ring.

11. The closed loop current transformer of claim 5, wherein the magnetic ring is a circular ring or a square ring.

12. The closed loop current transformer of claim 6, wherein the magnetic ring is a circular ring or a square ring.

* * * * *